(12) United States Patent
Sasaki et al.

(10) Patent No.: US 10,595,412 B2
(45) Date of Patent: Mar. 17, 2020

(54) SEMICONDUCTOR DEVICE, ELECTRONIC DEVICE, METHOD OF MANUFACTURING SEMICONDUCTOR DEVICE, AND METHOD OF MANUFACTURING ELECTRONIC DEVICE

(71) Applicant: FUJITSU LIMITED, Kawasaki-shi, Kanagawa (JP)

(72) Inventors: Shinya Sasaki, Ebina (JP); Tsuyoshi Kanki, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/676,850

(22) Filed: Aug. 14, 2017

(65) Prior Publication Data

US 2018/0063960 A1 Mar. 1, 2018

(30) Foreign Application Priority Data

Aug. 31, 2016 (JP) .................................. 2016-169415

(51) Int. Cl.
*H05K 1/11* (2006.01)
*H05K 1/18* (2006.01)
(Continued)

(52) U.S. Cl.
CPC .......... *H05K 1/181* (2013.01); *H01L 21/4853* (2013.01); *H01L 21/563* (2013.01); *H01L 23/145* (2013.01); *H01L 23/3157* (2013.01); *H01L 23/5384* (2013.01); *H01L 23/5386* (2013.01); *H01L 24/16* (2013.01);
(Continued)

(58) Field of Classification Search
CPC ............... H05K 1/0201; H05K 1/0209; H05K 2201/10378; H05K 2201/10416; H05K 2201/09036; H05K 1/141; H05K 1/0206; H05K 1/0204; H05K 3/323; H05K 2203/0278; H05K 1/111; H05K 3/341;
(Continued)

(56) References Cited

U.S. PATENT DOCUMENTS 6,330,166 B1 * 12/2001 Aoyama ........... H01L 23/49816
174/260
6,552,907 B1 * 4/2003 Caldwell ............... H01L 23/367
174/252
(Continued)

FOREIGN PATENT DOCUMENTS

JP 2008-244104 10/2008
JP 2010-161184 7/2010

*Primary Examiner* — Steven T Sawyer
(74) *Attorney, Agent, or Firm* — Fujitsu Patent Center

(57) ABSTRACT

A semiconductor device includes a printed circuit board that includes a first electrode, a resin substrate that includes a first face directed toward the printed circuit board, a second electrode formed in a second portion surrounding a first portion of the first face, a second face opposite the first face, and a third electrode formed in a third portion of the second face, the third portion overlapping the first portion in a plan view, a semiconductor chip that includes a coupling terminal joined to the third electrode, a conductive member that is formed between the printed circuit board and the resin substrate and contains a conductive particle and resin, and a solder bump that is formed between the printed circuit board and the resin substrate and is joined to the first electrode and the second electrode.

3 Claims, 15 Drawing Sheets

(51) Int. Cl.

| | |
|---|---|
| H01L 21/48 | (2006.01) |
| H01L 21/56 | (2006.01) |
| H01L 23/14 | (2006.01) |
| H01L 23/31 | (2006.01) |
| H01L 23/538 | (2006.01) |
| H01L 23/00 | (2006.01) |
| H05K 3/34 | (2006.01) |
| H05K 3/40 | (2006.01) |
| H01L 23/498 | (2006.01) |
| H01L 25/065 | (2006.01) |
| H01L 25/00 | (2006.01) |

(52) U.S. Cl.
CPC ........... *H05K 1/111* (2013.01); *H05K 3/3436* (2013.01); *H05K 3/4007* (2013.01); *H01L 23/49816* (2013.01); *H01L 23/5385* (2013.01); *H01L 24/13* (2013.01); *H01L 24/32* (2013.01); *H01L 24/73* (2013.01); *H01L 24/81* (2013.01); *H01L 24/92* (2013.01); *H01L 25/0655* (2013.01); *H01L 25/50* (2013.01); *H01L 2224/0401* (2013.01); *H01L 2224/13111* (2013.01); *H01L 2224/13139* (2013.01); *H01L 2224/13144* (2013.01); *H01L 2224/13147* (2013.01); *H01L 2224/16227* (2013.01); *H01L 2224/16238* (2013.01); *H01L 2224/32225* (2013.01); *H01L 2224/73204* (2013.01); *H01L 2224/81815* (2013.01); *H01L 2224/83855* (2013.01); *H01L 2224/92125* (2013.01); *H01L 2924/1033* (2013.01); *H01L 2924/10253* (2013.01); *H01L 2924/10272* (2013.01); *H01L 2924/10329* (2013.01); *H01L 2924/1579* (2013.01); *H01L 2924/15174* (2013.01); *H01L 2924/15192* (2013.01); *H01L 2924/15311* (2013.01); *H01L 2924/3511* (2013.01); *H05K 3/3494* (2013.01); *H05K 2201/10234* (2013.01); *H05K 2201/10378* (2013.01); *H05K 2201/10734* (2013.01)

(58) Field of Classification Search
CPC ........ H05K 2201/099; H01L 23/49833; H01L 23/49816
USPC ........................................................ 174/252
See application file for complete search history.

(56) References Cited

U.S. PATENT DOCUMENTS

| | | | | |
|---|---|---|---|---|
| 2001/0000915 | A1* | 5/2001 | Katchmar | H01L 23/49838 257/1 |
| 2001/0015286 | A1* | 8/2001 | Shibata | H05K 3/323 174/260 |
| 2002/0134582 | A1* | 9/2002 | Celaya | H01L 23/49811 174/261 |
| 2004/0174651 | A1* | 9/2004 | Aisenbrey | F28D 15/04 361/103 |
| 2004/0201106 | A1* | 10/2004 | Mercado | H01L 23/49816 257/772 |
| 2008/0237846 | A1 | 10/2008 | Terui et al. | |
| 2009/0268422 | A1* | 10/2009 | Bailey | G11C 5/02 361/803 |
| 2010/0148359 | A1* | 6/2010 | Quevedo | H01L 23/49816 257/725 |
| 2010/0171213 | A1 | 7/2010 | Hisano et al. | |
| 2015/0380337 | A1* | 12/2015 | Yu | H01L 23/3114 257/712 |
| 2016/0150632 | A1* | 5/2016 | Viswanathan | H05K 3/284 361/761 |

* cited by examiner

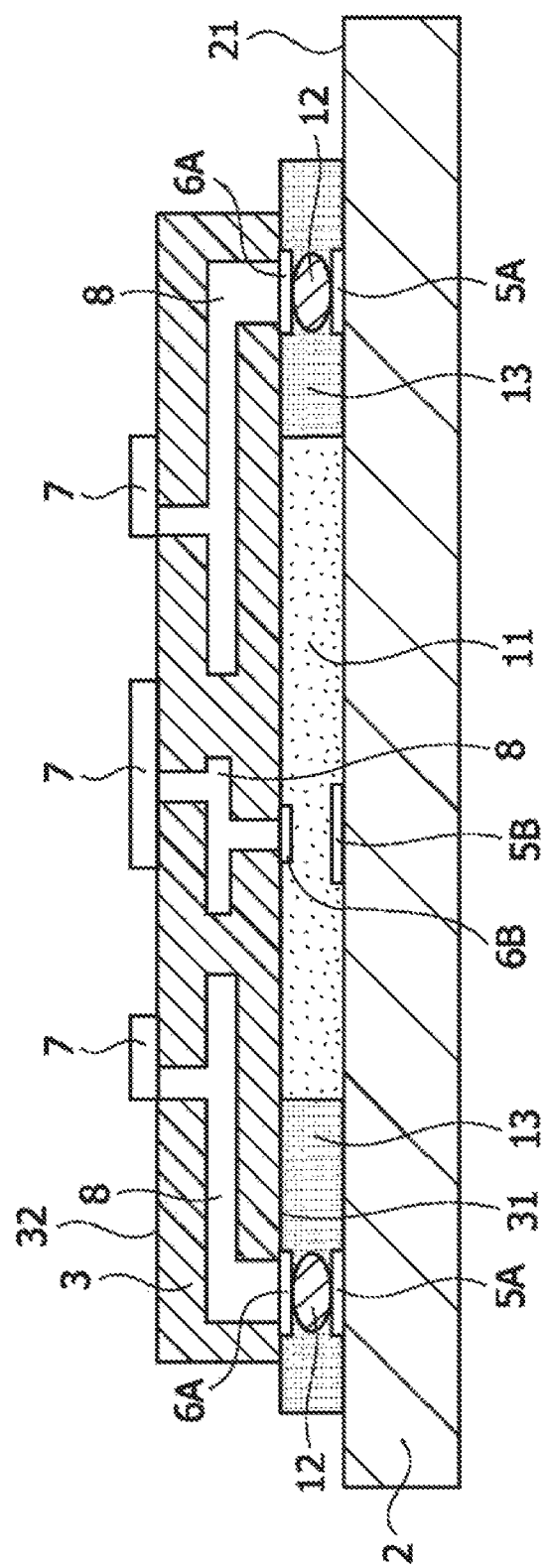

SEMICONDUCTOR DEVICE, ELECTRONIC DEVICE, METHOD OF MANUFACTURING SEMICONDUCTOR DEVICE, AND METHOD OF MANUFACTURING ELECTRONIC DEVICE

CROSS-REFERENCE TO RELATED APPLICATION

This application is based upon and claims the benefit of priority of the prior Japanese Patent Application No. 2016-169415, filed on Aug. 31, 2016, the entire contents of which are incorporated herein by reference.

FIELD

The embodiments discussed herein are related to a semiconductor device, an electronic device, a method of manufacturing a semiconductor device, and a method of manufacturing an electronic device.

BACKGROUND

With increase in speed and integration of semiconductor chips (semiconductor elements), servers where semiconductor chips are installed use micro wires to couple the semiconductor chips and transmission speeds among the semiconductor chips have also been increasing. Three-dimensional packaging techniques are under development, which enable high-speed transmission by forming through silicon vias (TSVs) or the like in semiconductor chips, stacking the semiconductor chips, and coupling the semiconductor chips using minute bumps. According to such three-dimensional packaging techniques, since TSVs are formed in semiconductor chips, increase in cost for semiconductor chips and many problems related to processes are caused and the three-dimensional packaging techniques are limited to certain applications including memory. In addition, 2.5-dimensional packaging techniques are also under development, by which high-speed transmission is performed through a silicon interposer or the like arranged as an intermediate board between a semiconductor chip and a printed circuit board.

Also in the 2.5-dimensional packaging techniques, TSVs are formed in a silicon interposer and cost for such a silicon interposer increases. Although glass interposers are also under development so as to address the increase and reduce the cost, practical utilization has not been achieved, yet. For cost reduction, use of resin interposers (resin substrates) is under review.

FIGS. 11A to 11C are process diagrams that illustrate packaging techniques using a resin interposer. According to the packaging techniques using a resin interposer, as illustrated in FIG. 11A, solder bumps 110 are formed over a printed circuit board 101. After that, as illustrated in FIG. 11B, a resin interposer 102 is mounted over the printed circuit board 101 using a flip-chip bonder and as illustrated in FIG. 11C, semiconductor chips 103 are mounted over the resin interposer 102. On the semiconductor chips 103, for example, micro-bumps 131, which each have a height of 25 µm, a diameter Φ of 25 µm, and a pitch of 45 µm, are formed and the resin interposer 102 and the semiconductor chips 103 are joined to each other through the micro-bumps 131. Since the size of each micro-bump 131 is small, tolerance for warpage or waviness on a surface 121 of the resin interposer 102 is small. Accordingly, it is desirable for the surface 121 of the resin interposer 102 to be even.

A material of the resin interposer 102 is resin. Thus, when the resin interposer 102 is mounted over the printed circuit board 101, the rigidity of a member that supports the resin interposer 102 affects the resin interposer 102. As illustrated in FIGS. 11B and 11C, the solder bumps 110 and a solder resist 111 are formed between the printed circuit board 101 and the resin interposer 102, and the solder bumps 110 and the solder resist 111 support the resin interposer 102. As the shape of the resin interposer 102 follows the shape of the solder bumps 110 because of a difference in magnitude between the rigidity of each solder bump 110 and the rigidity of the solder resist 111, waviness is caused in the resin interposer 102. Accordingly, unevenness occurs on the surface 121 of the resin interposer 102. As the thickness of the resin interposer 102 decreases, the unevenness on the surface 121 of the resin interposer 102 increases. When for example, the thickness of the resin interposer 102 is 25 µm and the height of the solder bump 110 is 90 µm, the difference in level of the unevenness on the surface of the resin interposer 102 is 50 to 60 µm. Thus, it is difficult to mount the semiconductor chips 103 over the resin interposer 102 through the micro-bump 131 that each have a height of 25 µm for example.

The followings are reference documents.
[Document 1] Japanese Laid-open Patent Publication No. 2008-244104 and
[Document 2] Japanese Laid-open Patent Publication No. 2010-161184.

SUMMARY

According to an aspect of the invention, a semiconductor device includes a printed circuit board that includes a first electrode, a resin substrate that includes a first face directed toward the printed circuit board, a second electrode formed in a second portion surrounding a first portion of the first face, a second face opposite the first face, and a third electrode formed in a third portion of the second face, the third portion overlapping the first portion in a plan view, a semiconductor chip that includes a coupling terminal joined to the third electrode, a conductive member that is formed between the printed circuit board and the resin substrate and contains a conductive particle and resin, and a solder bump that is formed between the printed circuit board and the resin substrate and is joined to the first electrode and the second electrode, wherein the conductive member that comes into contact with the printed circuit board and the first portion of the first face of the resin substrate.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 6 is a process diagram that illustrates the example of the method of manufacturing the semiconductor device;

DESCRIPTION OF EMBODIMENTS

Figure 1:
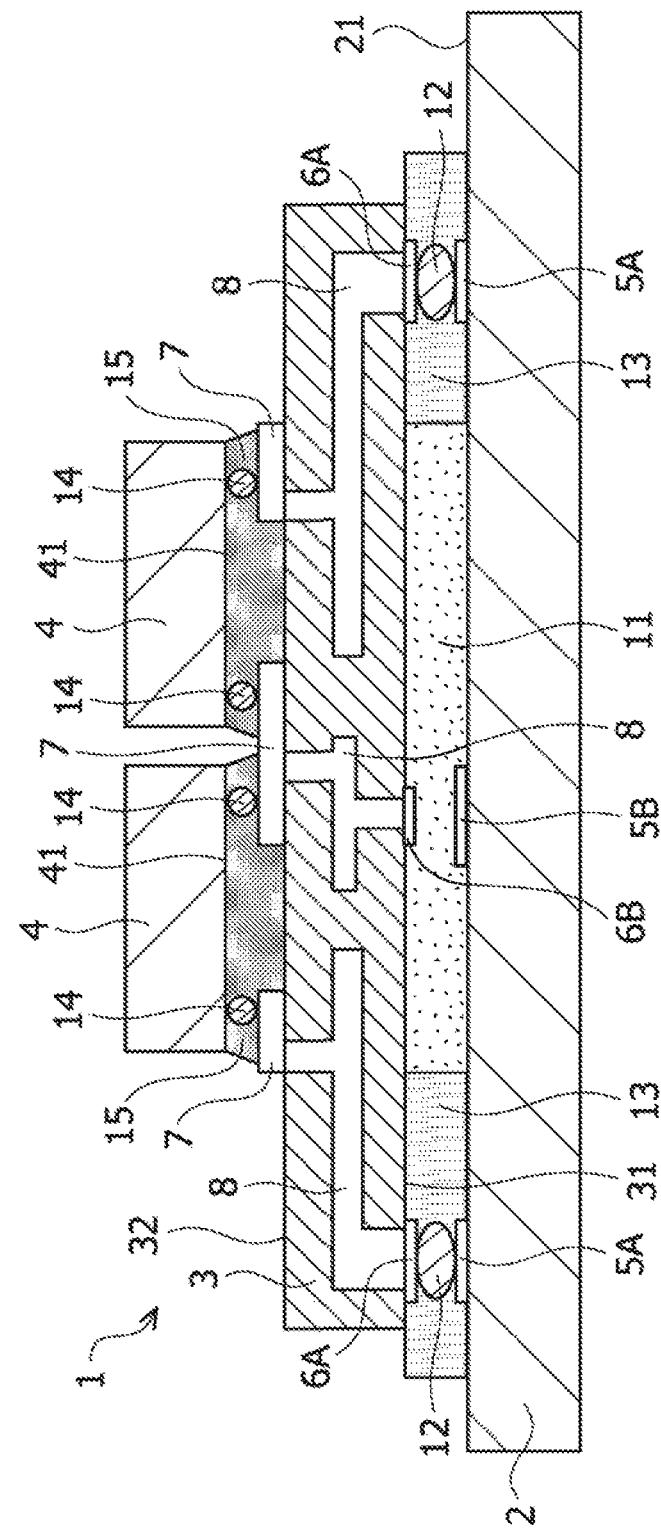
FIG. 1 is a cross-sectional view of a semiconductor device.

Described below are a semiconductor device, an electronic device, a method of manufacturing the semiconductor device, and a method of manufacturing the electronic device according to embodiments by referring to the drawings. Structures of the semiconductor device, the electronic device, the method of manufacturing the semiconductor device, and the method of manufacturing the electronic device described below are examples and the present disclosure is not limited to the structures of the semiconductor device, the electronic device, the method of manufacturing the semiconductor device, and the method of manufacturing the electronic device according to the embodiments.

Structure of Semiconductor Device 1

FIG. 1 is a cross-sectional view of a semiconductor device 1. The semiconductor device 1 includes a printed circuit board 2, a resin interposer 3, which is mounted over the printed circuit board 2, and semiconductor chips 4, which are mounted over the resin interposer 3. The resin interposer 3 is an example of a resin substrate. The printed circuit board 2 includes a resin layer, which is not illustrated, and a wiring layer, which is formed in the resin layer and is not illustrated. The printed circuit board 2 includes metal pads 5A and 5B. The metal pads 5A and 5B are formed on an upper face 21 of the printed circuit board 2. The metal pad 5A is an example of a first electrode.

The resin interposer 3 includes a first face (a lower face) 31, which is directed toward the printed circuit board 2, and includes a second face (an upper face) 32, which is opposite the first face 31. The upper face 21 of the printed circuit board 2 and the first face 31 of the resin interposer 3 face each other. The resin interposer 3 includes metal pads 6A and 6B, which are formed on the first face 31 of the resin interposer 3, and metal pads 7, which are formed on the second face 32 of the resin interposer 3. The metal pad 6A is an example of a second electrode. The metal pad 7 is an example of a third electrode. As the metal pads 5A, 5B, 6A, 6B, and 7, for example, copper (Cu) or Cu with a surface that is plated with nickel (Ni), gold (Au), or the like may be used.

The metal pads 6A are formed in a peripheral portion surrounding a central portion of the first face 31 of the resin interposer 3, and the metal pad 6B is formed in the central portion of the first face 31 of the resin interposer 3. The central portion of the first face 31 of the resin interposer 3 is an example of a first portion of a first face. The peripheral portion surrounding the central portion of the first face 31 of the resin interposer 3 is an example of a second portion surrounding the first portion of the first face. The metal pads 7 are formed in a central portion of the second face 32 of the resin interposer 3. The central portion of the second face 32 of the resin interposer 3 overlaps the central portion of the first face 31 of the resin interposer 3 in a plan view. For example, the outer edge (the periphery) of the central portion of the second face 32 of the resin interposer 3 may match or approximately match the outer edge (the periphery) of the central portion of the first face 31 of the resin interposer 3 in a plan view. The central portion of the second face 32 of the resin interposer 3 is an example of a third portion of a second face. The resin interposer 3 includes a wiring layer 8 formed in the resin interposer 3. The wiring layer 8 includes wires and vias. Through the wiring layer 8, the metal pads 6A and the metal pads 7 are electrically coupled to each other, and the metal pad 6B and the metal pad 7 are electrically coupled to each other.

A conductive member 11, solder bumps 12, and a solder resist 13 are formed between the printed circuit board 2 and the resin interposer 3. The conductive member 11 is a mixture containing conductive particles and resin. The conductive member 11 is formed by hardening a conductive paste. As the conductive particles contained in the conductive member 11, for example, at least one kind of metal selected from tin (Sn), silver (Ag), Cu, Au, lead (Pb), palladium (Pd), Ni, and the like, an alloy of such kinds of metal, or carbon (C) may be used. As the resin contained in the conductive member 11, for example, resin with high resistance to heat may be used, such as epoxy resin, polyester resin, phenol resin, or silicon resin. As the solder bumps 12, for example, Sn or an alloy containing Sn may be used. The solder resist 13 is for example, photosensitive insulating resin. The solder resist 13 is formed around the solder bumps 12.

The particle diameter of each conductive particle contained in the conductive member 11 is smaller than the height of each solder bump 12. When the particle diameter of each conductive particle contained in the conductive member 11 is larger than the height of each solder bump 12, a step may be caused between the central portion and the peripheral portion of the resin interposer 3. When the particle diameter of each conductive particle contained in the conductive member 11 is smaller than the height of each solder bump 12, the evenness of the resin interposer 3 is increased. It is desirable for the particle diameter of each conductive particle contained in the conductive member 11 to be larger than or equal to 1 μm and be smaller than or equal to 25 μm.

The conductive member 11 is in contact with the upper face 21 of the printed circuit board 2 and is in contact with the central portion of the first face 31 of the resin interposer 3. The conductive member 11 is electrically coupled to the metal pad 5B formed on the upper face 21 of the printed circuit board 2 and is electrically coupled to the metal pad 6B formed in the central portion of the first face 31 of the resin interposer 3. The conductive member 11 may be joined to the metal pad 5B formed on the upper face 21 of the printed circuit board 2. The conductive member 11 may be joined to the metal pad 6B formed on the first face 31 of the resin interposer 3. The solder bumps 12 are joined to the metal pads 5A formed on the upper face 21 of the printed circuit board 2 and are joined to the metal pads 6A formed in the peripheral portion surrounding the central portion of the first face 31 of the resin interposer 3.

As materials of the semiconductor chips 4, for example, silicon, gallium nitride (GaN), gallium arsenide (GaAs), and silicon carbide (SiC) may be used. Coupling terminals 14 are formed on a lower face 41 of each semiconductor chip 4. The lower face 41 of each semiconductor chip 4 may be a circuit face where a circuit is formed. The second face 32 of the resin interposer 3 and the lower faces 41 of the semiconductor chips 4 face each other. The coupling terminals 14 are electrically coupled to electrodes formed on the lower faces 41 of the semiconductor chips 4, which are not illustrated. The coupling terminals 14 may be metal posts.

The metal posts are formed using at least one kind of metal selected from Cu, Ag, Sn, Au, and the like or an alloy of such kinds of metal. The coupling terminals 14 may be solder bumps. An underfill 15 is formed between the resin interposer 3 and each semiconductor chip 4. The coupling terminals 14 are also referred to as micro-bumps.

The conductive member 11 may be part of a power-supply channel formed between the printed circuit board 2 and the semiconductor chips 4. The conductive member 11 may be a power-supply line or a ground line. Using the conductive member 11 as a power-supply line obviates the desire for making space for forming a power-supply line in the peripheral portion of the first face 31 of the resin interposer 3 and accordingly, upsizing of the resin interposer 3 may be inhibited. Using the conductive member 11 as a ground line obviates the desire for making space for forming a ground line in the peripheral portion of the first face 31 of the resin interposer 3 and accordingly, upsizing of the resin interposer 3 may be inhibited. Thus, enlargement of an area of the printed circuit board 2 over which the resin interposer 3 is mounted may be inhibited. One of the plurality of solder bumps 12 may be part of a power-supply channel formed between the printed circuit board 2 and the semiconductor chips 4. One of the plurality of solder bumps 12 may be a power-supply line or a ground line.

Signal transmission may be performed between the printed circuit board 2 and the resin interposer 3 through the solder bumps 12. Signal transmission may be performed between the printed circuit board 2 and the semiconductor chips 4 through the resin interposer 3 and the solder bumps 12. The solder bumps 12 may be part of a signal channel formed between the printed circuit board 2 and the semiconductor chips 4. The solder bumps 12 may be signal lines.

The conductive member 11 is in contact with the upper face 21 of the printed circuit board 2 and is in contact with the central portion of the first face 31 of the resin interposer 3. Since a clearance between a conductive particle and another conductive particle that are contained in the conductive member 11 is small, the rigidity of the conductive member 11 is large. By the conductive member 11 supporting a central portion of the resin interposer 3, deformation in the central portion of the resin interposer 3 may be inhibited in mounting the resin interposer 3 over the printed circuit board 2. Thus, unevenness in the central portion of the second face 32 of the resin interposer 3 may be inhibited and evenness in the central portion of the second face 32 of the resin interposer 3 is increased. As a result, when the semiconductor chips 4 are mounted over the central portion of the second face 32 of the resin interposer 3, joining between the resin interposer 3 and the coupling terminals 14 is secured and joining between the semiconductor chips 4 and the coupling terminals 14 is secured. Since the evenness in the central portion of the second face 32 of the resin interposer 3 is increased, the semiconductor chips 4 may be mounted over the resin interposer 3 using minute micro-bumps as the coupling terminals 14.

As the outer size of the conductive member 11 increases, an even portion on the second face 32 of the resin interposer 3 becomes larger and the outer size of the resin interposer 3 also increases. To inhibit enlargement of an area of the printed circuit board 2 over which the resin interposer 3 is mounted, it is desirable that the size of a region included in the second face 32 of the resin interposer 3 over which the semiconductor chips 4 are mounted and the outer size of the conductive member 11 match or approximately match each other. The region included in the second face 32 of the resin interposer 3 over which the semiconductor chips 4 are mounted corresponds to the central portion of the second face 32 of the resin interposer 3. Thus, it is desirable that the size of the central portion of the second face 32 of the resin interposer 3 and the outer size of the conductive member 11 match or approximately match each other. The metal pads 7, the semiconductor chips 4, and the coupling terminals 14 may overlap the conductive member 11 in a plan view. As a result of the metal pads 7, the semiconductor chips 4, and the coupling terminals 14 overlapping the conductive member 11 in a plan view, evenness in the region included in the second face 32 of the resin interposer 3 over which the semiconductor chips 4 are mounted is increased.

Figure 2:
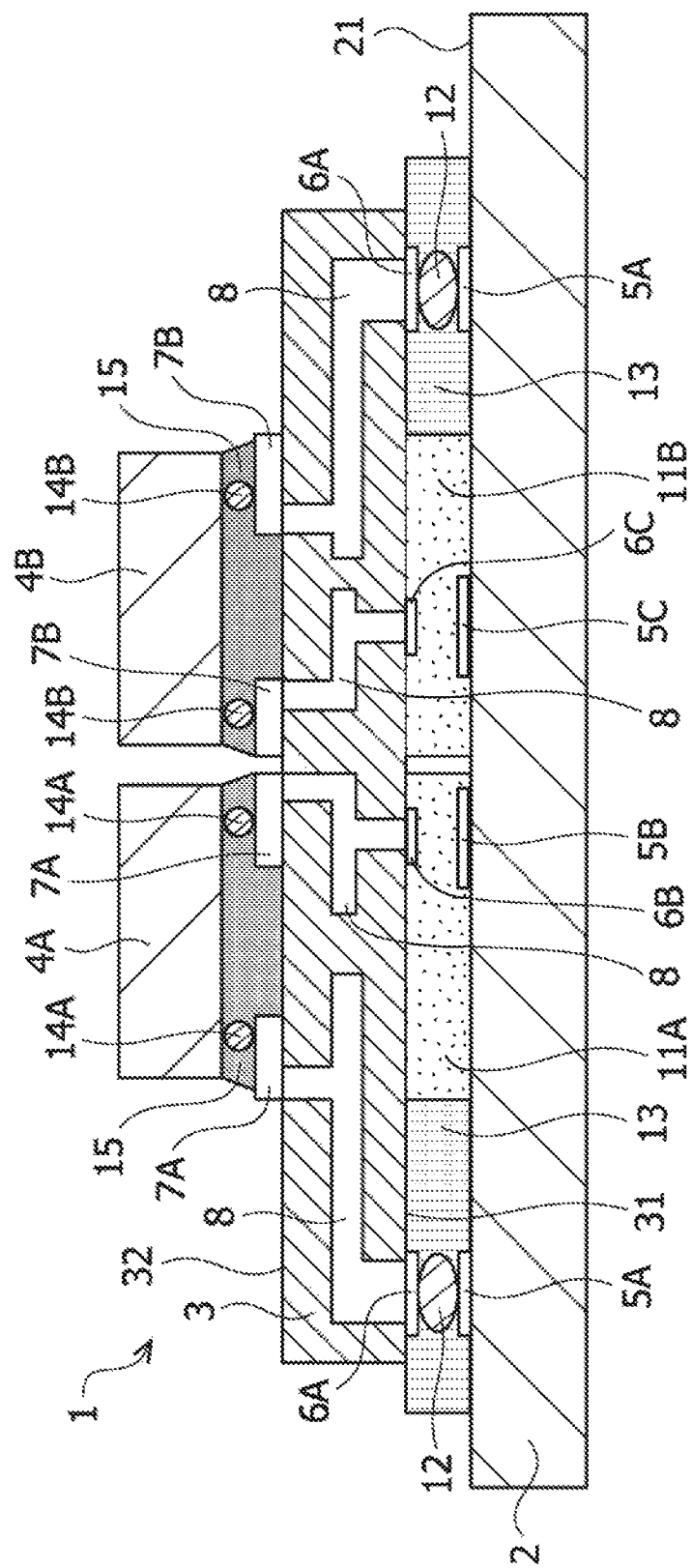
FIG. 2 is a cross-sectional view of the semiconductor device.

As illustrated in FIG. 2, conductive members 11A and 11B may be formed between the printed circuit board 2 and the resin interposer 3. FIG. 2 is a cross-sectional view of the semiconductor device 1. The respective structures of semiconductor chips 4A and 4B, metal pads 7A and 7B, the conductive members 11A and 11B, and coupling terminals 14A and 14B illustrated in FIG. 2 are similar to the respective structures of the semiconductor chips 4, the metal pads 7, the conductive members 11, and the coupling terminals 14 illustrated in FIG. 1. For example, the conductive member 11A may be a power-supply line and the conductive member 11B may be a ground line. For another example, the conductive member 11A may be a ground line and the conductive member 11B may be a power-supply line.

The conductive member 11A is electrically coupled to a metal pad 5B formed on the upper face 21 of the printed circuit board 2 and is electrically coupled to a metal pad 6B formed on the first face 31 of the resin interposer 3. The conductive member 11B is electrically coupled to a metal pad 5C formed on the upper face 21 of the printed circuit board 2 and is electrically coupled to a metal pad 6C formed on the first face 31 of the resin interposer 3. The conductive member 11A may be joined to the metal pad 5B formed on the upper face 21 of the printed circuit board 2. The conductive member 11A may be joined to the metal pad 6B formed on the first face 31 of the resin interposer 3. The conductive member 11B may be joined to the metal pad 5C formed on the upper face 21 of the printed circuit board 2. The conductive member 11B may be joined to the metal pad 6C formed on the first face 31 of the resin interposer 3. The respective structures of the metal pads 5C and 6C are similar to the respective structures of the metal pads 5B and 6B.

Since using the conductive member 11A as a power-supply line and using the conductive member 11B as a ground line obviate the desire for making space for forming a power-supply line and a ground line in the peripheral portion of the first face 31 of the resin interposer 3, upsizing of the resin interposer 3 may be inhibited. Since using the conductive member 11A as a ground line and using the conductive member 11B as a power-supply line obviate the desire for making space for forming a power-supply line and a ground line in the peripheral portion of the first face 31 of the resin interposer 3, upsizing of the resin interposer 3 may be inhibited. Thus, enlargement of an area of the printed circuit board 2 over which the resin interposer 3 is mounted may be inhibited.

It is desirable that the size of a region included in the second face 32 of the resin interposer 3 over which the semiconductor chip 4A is mounted and the outer size of the conductive member 11A match or approximately match each other. It is desirable that the size of a region included in the second face 32 of the resin interposer 3 over which the semiconductor chip 4B is mounted and the outer size of the conductive member 11B match or approximately match each other. The metal pads 7A, the semiconductor chip 4A, and the coupling terminals 14A may overlap the conductive member 11A in a plan view. As a result of the metal pads 7A, the semiconductor chip 4A, and the coupling terminals 14A overlapping the conductive member 11A in a plan view, evenness in the region included in the second face 32 of the resin interposer 3 over which the semiconductor chip 4A is mounted is increased. The metal pads 7B, the semiconductor chip 4B, and the coupling terminals 14B may overlap the conductive member 11B in a plan view. As a result of the metal pads 7B, the semiconductor chip 4B, and the coupling terminals 14B overlapping the conductive member 11B in a plan view, evenness in the region included in the second face 32 of the resin interposer 3 over which the semiconductor chip 4B is mounted is increased.

Method of Manufacturing Semiconductor Device 1

Figure 3:
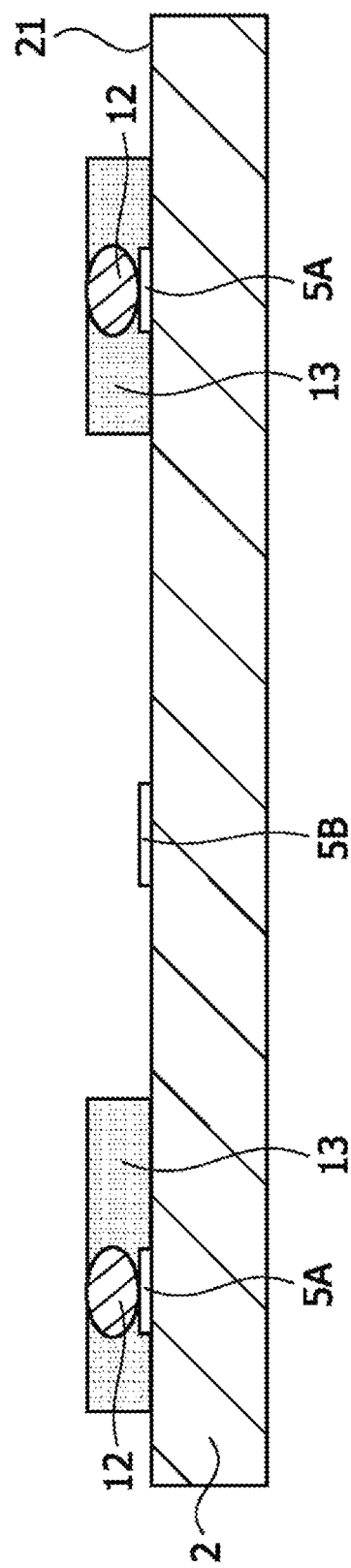
FIG. 3 is a process diagram that illustrates an example of a method of manufacturing the semiconductor device.

Referring to FIGS. 3 to 8C, an example of a method of manufacturing the semiconductor device 1 is described. As illustrated in FIG. 3, after placing the printed circuit board 2, the solder bumps 12 are formed over the upper face 21 of the printed circuit board 2. In this case, since the metal pads 5A are formed on the upper face 21 of the printed circuit board 2, the solder bumps 12 are formed on the metal pads 5A. For example, the solder bumps 12 may be formed on the metal pads 5A by printing on a solder paste using a metal mask and then performing reflow heat treatment, and forming the solder paste into bump shapes. For another example, the solder bumps 12 may be formed on the metal pads 5A by arranging solder balls on the metal pads 5A. Subsequently, the solder resist 13 is formed on the upper face 21 of the printed circuit board 2. The solder resist 13 covers the solder bumps 12. Top portions of the solder bumps 12 are exposed from the solder resist 13. The solder resist 13 that is photosensitive may be used. When the photosensitive solder resist 13 is used, the solder resist 13 is patterned by performing exposure to light and development.

Figure 4:
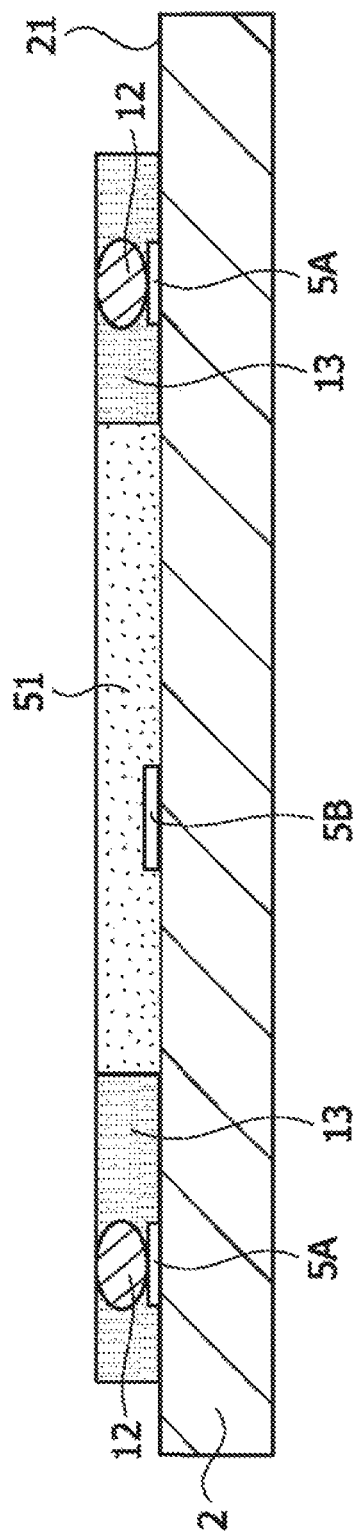
FIG. 4 is a process diagram that illustrates the example of the method of manufacturing the semiconductor device.
Figure 5A:
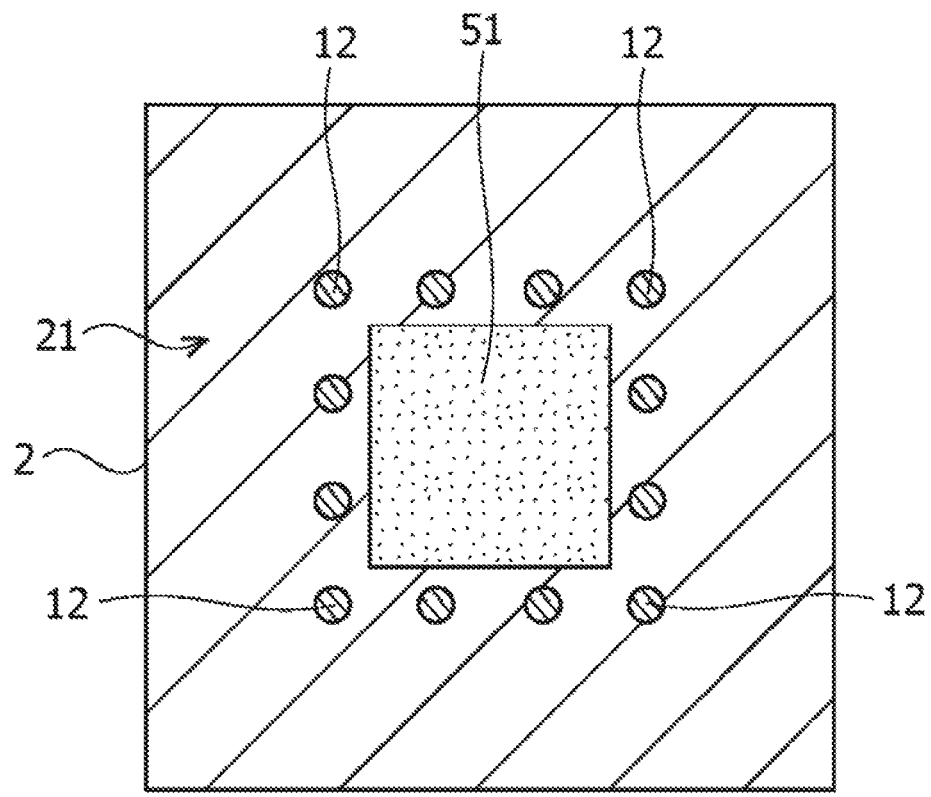
FIGS. 5A to 5C are plan view of a printed circuit board.

As illustrated in FIG. 4, a conductive paste 51 is formed on the upper face 21 of the printed circuit board 2. The conductive paste 51 contains conductive particles and resin. The conductive particles contained in the conductive paste 51 are dispersed. The conductive paste 51 is formed on the upper face 21 of the printed circuit board 2 by for example, printing on the conductive paste 51 using a metal mask. The conductive paste 51 covers the metal pad 5B. FIG. 5A is a plan view of the printed circuit board 2. In the example of the printed circuit board 2 illustrated in FIG. 5A, the illustration of the solder resist 13 is omitted. As illustrated in FIG. 5A, the conductive paste 51 is formed in a region surrounded by the plurality of solder bumps 12.

Figure 5B:
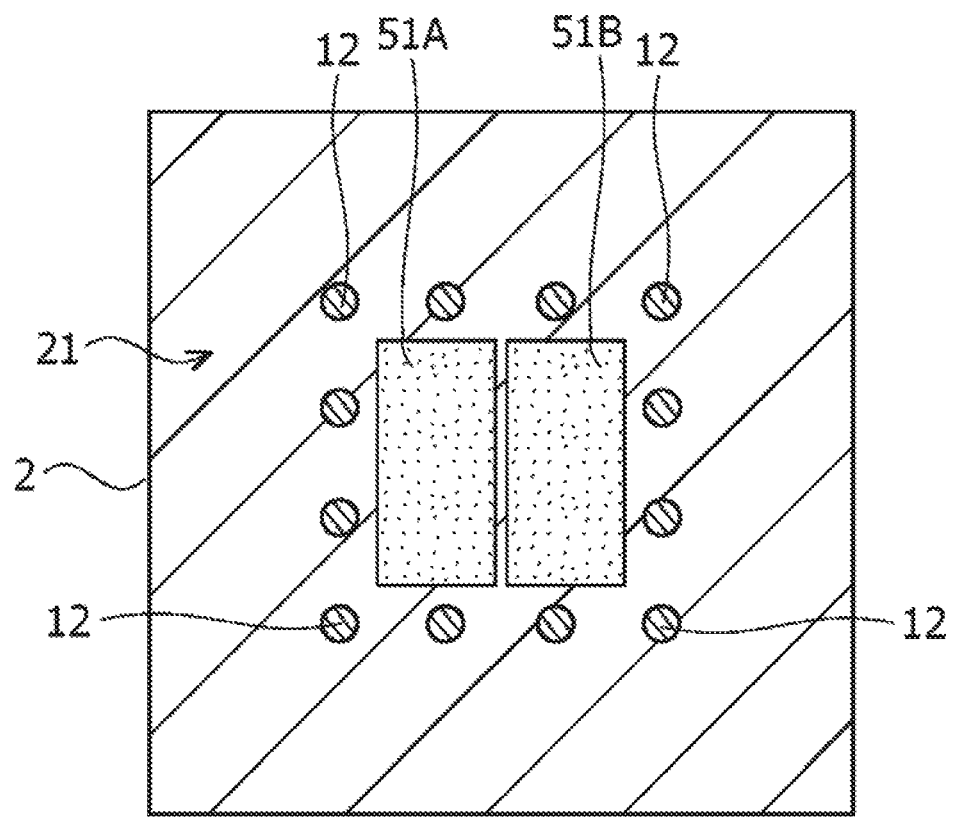
Figure 5C:
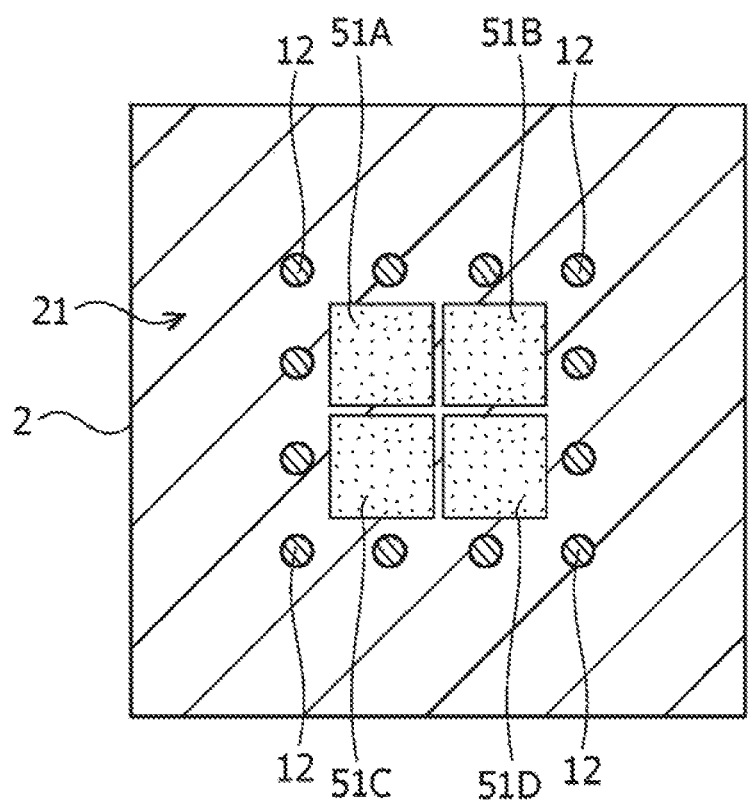

Instead of the examples illustrated in FIGS. 4 and 5A, a plurality of conductive pastes 51 may be formed on the upper face 21 of the printed circuit board 2. For example, as illustrated in FIG. 5B, conductive pastes 51A and 51B may be formed on the upper face 21 of the printed circuit board 2. FIG. 5B is a plan view of the printed circuit board 2. In the example of the printed circuit board 2 illustrated in FIG. 5B, the illustration of the solder resist 13 is omitted. As illustrated in FIG. 5B, the conductive pastes 51A and 51B are formed in regions surrounded by the plurality of solder bumps 12. For example, as illustrated in FIG. 5C, conductive pastes 51A to 51D may be formed on the upper face 21 of the printed circuit board 2. FIG. 5C is a plan view of the printed circuit board 2. In the example of the printed circuit board 2 illustrated in FIG. 5C, the illustration of the solder resist 13 is omitted. As illustrated in FIG. 5C, the conductive pastes 51A to 51D are formed in regions surrounded by the plurality of solder bumps 12. The respective structures of the conductive pastes 51A to 51D are similar to the structure of the conductive paste 51.

As illustrated in FIG. 6, the resin interposer 3 is mounted over the printed circuit board 2. The resin interposer 3 may be mounted as described below. After aligning the resin interposer 3 using a flip-chip bonder or a mounter, the resin interposer 3 is mounted over the printed circuit board 2. In this case, the conductive paste 51 is in contact with the central portion of the first face 31 of the resin interposer 3 and the solder bumps 12 are in contact with the metal pads 6A formed in the peripheral portion of the first face 31 of the resin interposer 3. Thus, the resin interposer 3 is mounted over the printed circuit board 2 by bringing the central portion of the first face 31 of the resin interposer 3 into contact with the conductive paste 51 and bringing the metal pads 6A into contact with the solder bumps 12.

After that, by performing reflow heat treatment, the solder bumps 12 are joined to the metal pads 5A and are joined to the metal pads 6A. Through the reflow heat treatment, the solder bumps 12 become molten and joined to the metal pads 5A and 6A. The reflow heat treatment in joining the solder bumps 12 to the metal pads 5A and 5B is an example of first heat treatment.

After that, the conductive member 11 is formed by performing heat treatment and hardening the conductive paste 51. Through the heat treatment, the resin contained in the conductive paste 51 is hardened and the conductive paste 51 is hardened accordingly. The conductive particles contained in the conductive paste 51 may be made molten by performing heat treatment. Since the time taken to make the solder bumps 12 molten is short and the time taken to harden the conductive paste 51 is long, the process time of the reflow heat treatment in joining the solder bumps 12 to the metal pads 5A and 5B is shorter the process time of the heat treatment in hardening the conductive paste 51. The heat treatment in hardening the conductive paste 51 is an example of second heat treatment.

Figure 7:
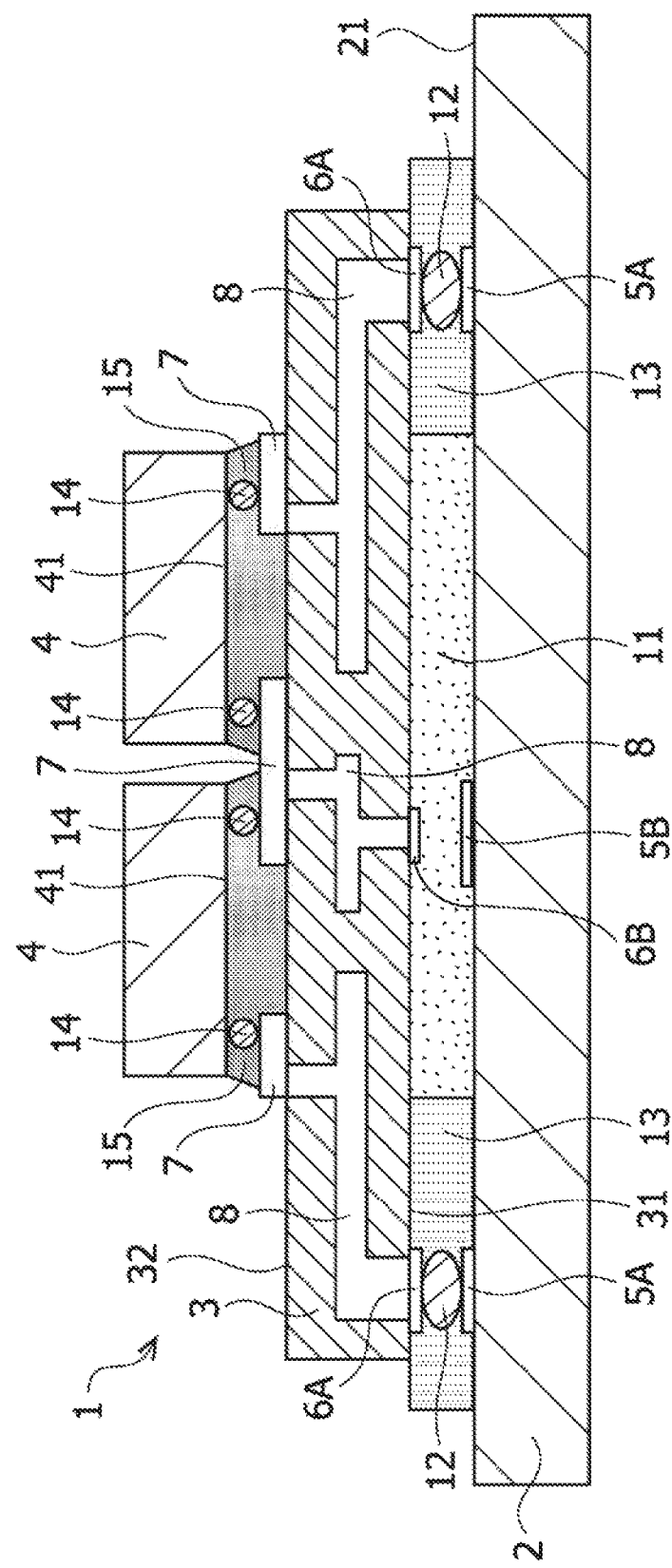
FIG. 7 is a process diagram that illustrates the example of the method of manufacturing the semiconductor device.

As illustrated in FIG. 7, the semiconductor chips 4 are mounted over the resin interposer 3. The semiconductor chip 4 may be mounted as described below. After aligning the semiconductor chips 4 using a flip-chip bonder or a mounter, the semiconductor chips 4 are mounted over the resin interposer 3. In this case, the coupling terminals 14 of the semiconductor chips 4 are in contact with the metal pads 7 of the resin interposer 3. Thus, the semiconductor chips 4 are mounted over the resin interposer 3 by bringing the coupling terminals 14 of the semiconductor chips 4 into contact with the metal pads 7 of the resin interposer 3.

After that, the coupling terminals 14 are joined to the metal pads 7 by performing reflow heat treatment. Through the reflow heat treatment, the coupling terminals 14 become molten and joined to the metal pads 7. The reflow heat treatment in joining the coupling terminals 14 to the metal pads 7 is an example of third heat treatment. Subsequently, the underfill 15 is filled between the resin interposer 3 and the semiconductor chips 4 and after that, cure (heat treatment) is performed so that the underfill 15 is hardened. The semiconductor device 1 is manufactured by performing the processes illustrated in FIGS. 3, 4, 6, and 7.

Figure 8A:
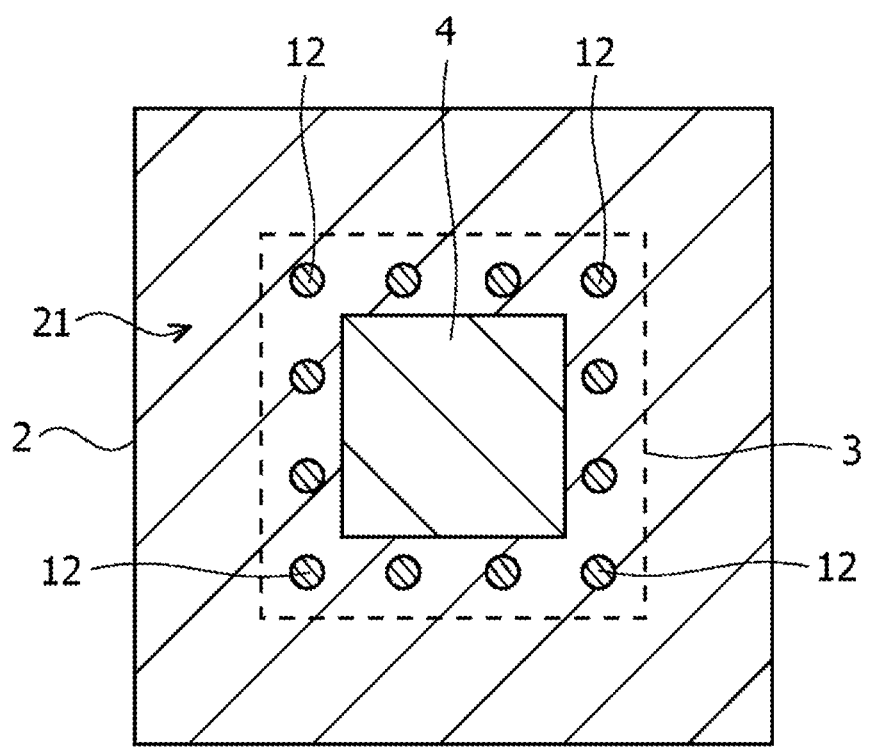
FIGS. 8A to 8C are plan view of a semiconductor device.
Figure 8B:
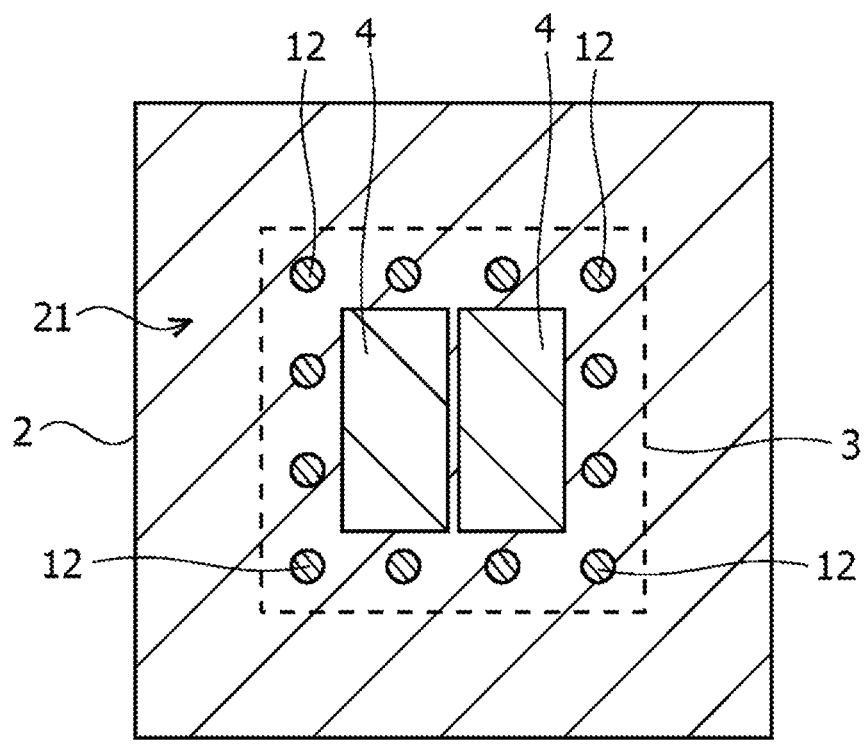
Figure 8C:
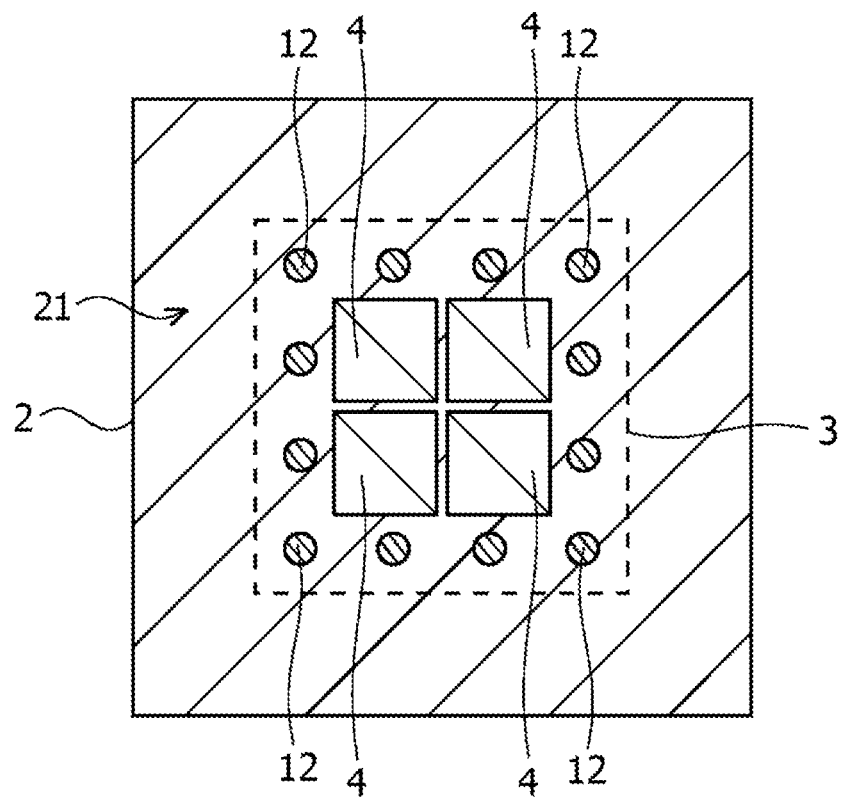

FIGS. 8A to 8C are plan views of the semiconductor device 1. In each of the examples of the semiconductor device 1 illustrated in FIGS. 8A to 8C, the outer portion of the resin interposer 3 is indicated with dashed lines and the illustration of the solder resist 13 is omitted. The semiconductor device 1 illustrated in FIG. 8A includes one semiconductor chip, 4. The semiconductor device 1 illustrated in FIG. 8B includes two semiconductor chips, 4. The semiconductor device 1 illustrated in FIG. 8C includes four semiconductor chips, 4.

Structure of Electronic Device 10

Figure 9:
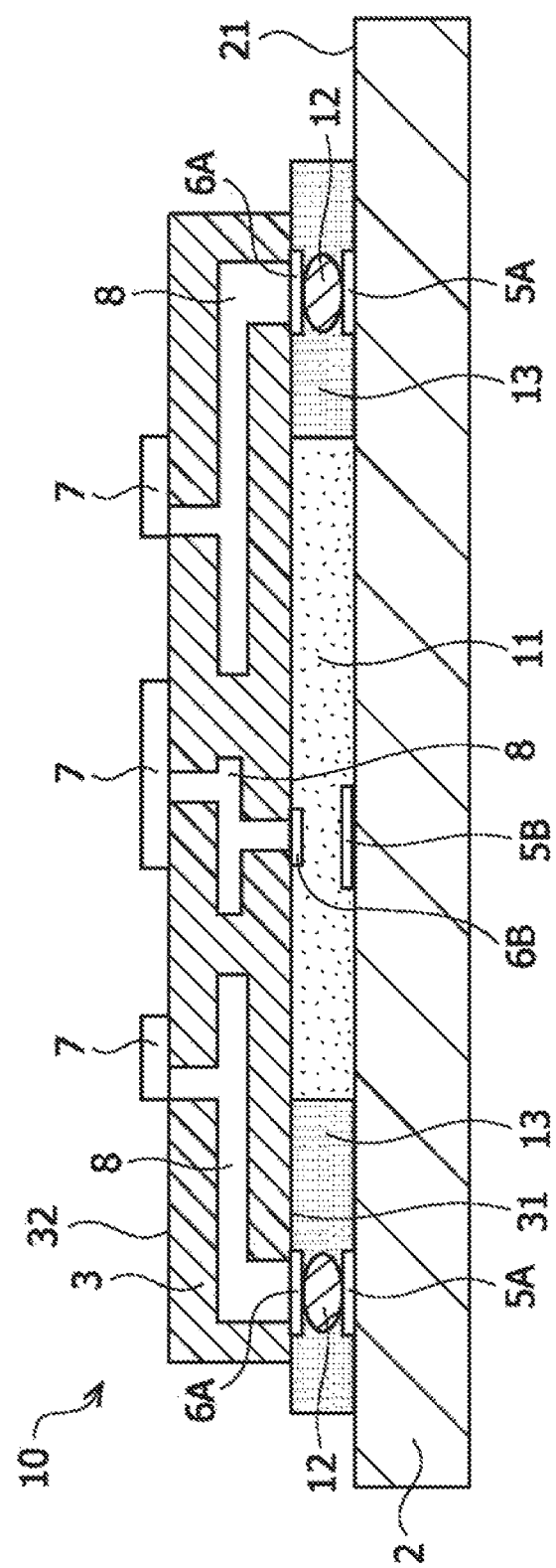
FIG. 9 is a cross-sectional view of an electronic device.

FIG. 9 is a cross-sectional view of an electronic device 10. The electronic device 10 includes a printed circuit board 2 and a resin interposer 3 mounted over the printed circuit board 2. The resin interposer 3 includes metal pads 6A and 6B, which are formed on a first face 31 of the resin interposer 3, and metal pads 7, which are formed on a second face 32 of the resin interposer 3. When semiconductor chips 4 are mounted over the resin interposer 3, coupling terminals 14 of the semiconductor chips 4 are joined to the metal pads 7 on the resin interposer 3.

A conductive member 11, solder bumps 12, and a solder resist 13 are formed between the printed circuit board 2 and the resin interposer 3. The conductive member 11 is in contact with an upper face 21 of the printed circuit board 2 and is in contact with a central portion of the first face 31 of the resin interposer 3. The conductive member 11 is electrically coupled to a metal pad 5B formed on the upper face 21 of the printed circuit board 2 and is electrically coupled to the metal pad 6B formed in the central portion of the first face 31 of the resin interposer 3. The conductive member 11 may be joined to the metal pad 5B formed on the upper face 21 of the printed circuit board 2. The conductive member 11 may be joined to the metal pad 6B formed on the first face 31 of the resin interposer 3. The solder bumps 12 are joined to metal pads 5A formed on the upper face 21 of the printed circuit board 2 and are joined to the metal pads 6A formed in a peripheral portion of the first face 31 of the resin interposer 3, which surrounds the central portion.

The conductive member 11 may be part of a power-supply channel formed between the printed circuit board 2 and the resin interposer 3. The conductive member 11 may be a power-supply line or a ground line. One of the plurality of solder bumps 12 may be part of a power-supply channel formed between the printed circuit board 2 and the resin interposer 3. One of the plurality of solder bumps 12 may be a power-supply line or a ground line.

Signal transmission may be performed between the printed circuit board 2 and the resin interposer 3 through the solder bumps 12. The solder bumps 12 may be part of a signal channel formed between the printed circuit board 2 and the resin interposer 3. The solder bumps 12 may be signal lines.

The conductive member 11 is in contact with the upper face 21 of the printed circuit board 2 and is in contact with the central portion of the first face 31 of the resin interposer 3. Since a clearance between a conductive particle and another conductive particle that are contained in the conductive member 11 is small, the rigidity of the conductive member 11 is large. By the conductive member 11 supporting a central portion of the resin interposer 3, deformation in a central portion of the resin interposer 3 may be inhibited. Thus, unevenness in a central portion of the second face 32 of the resin interposer 3 may be inhibited and evenness in the central portion of the second face 32 of the resin interposer 3 is increased. As a result, when the semiconductor chips 4 are mounted over the central portion of the second face 32 of the resin interposer 3, joining between the resin interposer 3 and the coupling terminals 14 is secured and joining between the semiconductor chips 4 and the coupling terminals 14 is secured. Since the evenness in the central portion of the second face 32 of the resin interposer 3 is increased, the semiconductor chips 4 may be mounted over the resin interposer 3 using minute micro-bumps as the coupling terminals 14.

The metal pads 7, the semiconductor chips 4, and the coupling terminals 14 may overlap the conductive member 11 in a plan view. As a result of the metal pads 7, the semiconductor chips 4, and the coupling terminals 14 overlapping the conductive member 11 in a plan view, evenness in the region included in the second face 32 of the resin interposer 3 over which the semiconductor chips 4 are mounted is increased.

Figure 10:
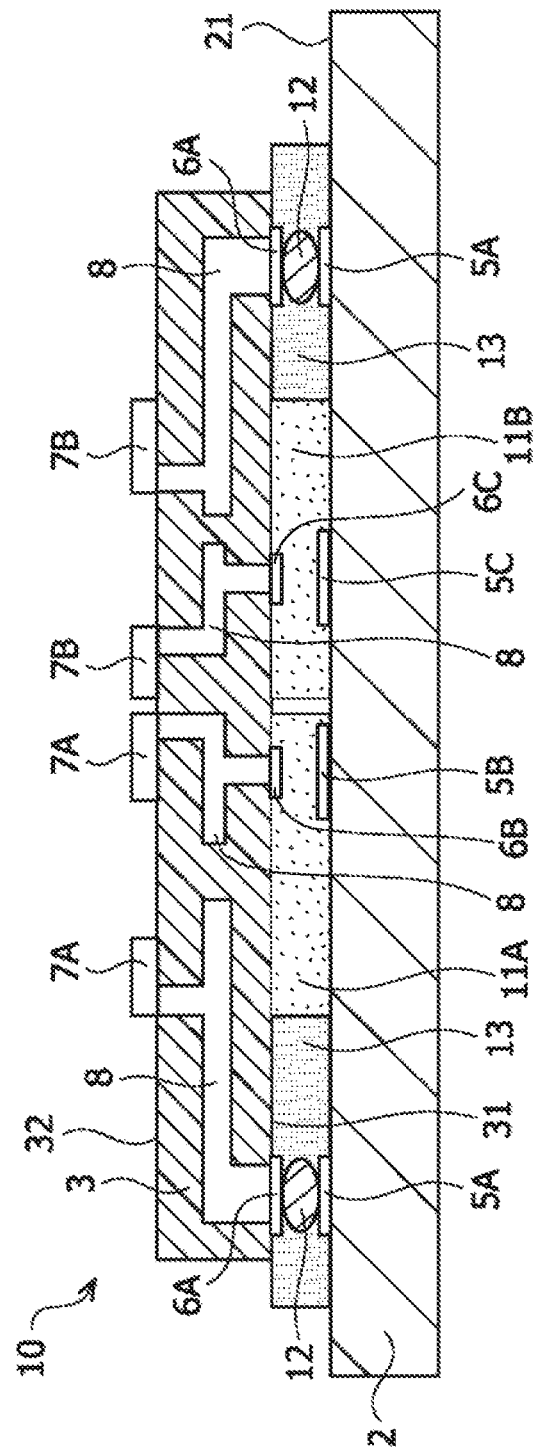
FIG. 10 is a cross-sectional view of the electronic device.
Figure 11A:
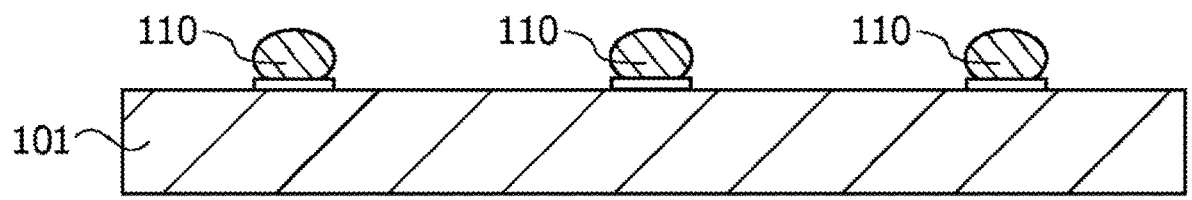
FIGS. 11A to 11C are process diagrams that illustrate packaging techniques using a resin interposer.
Figure 11B:
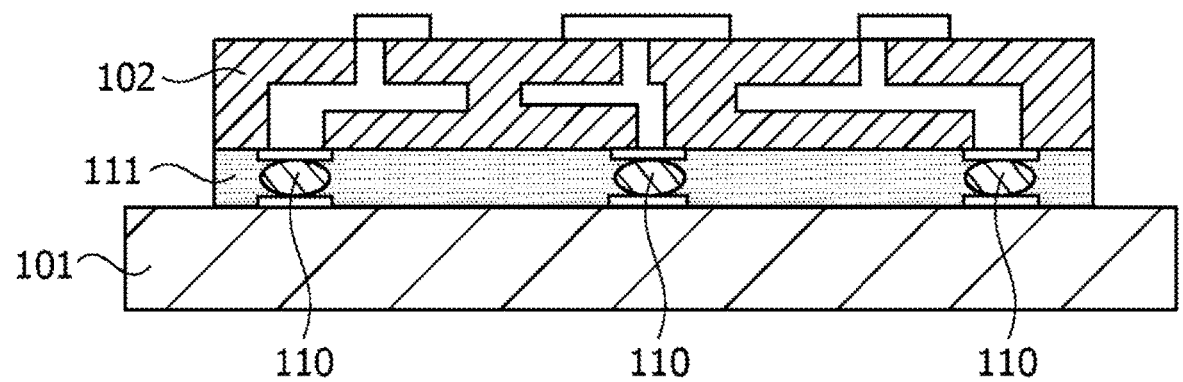
Figure 11C:
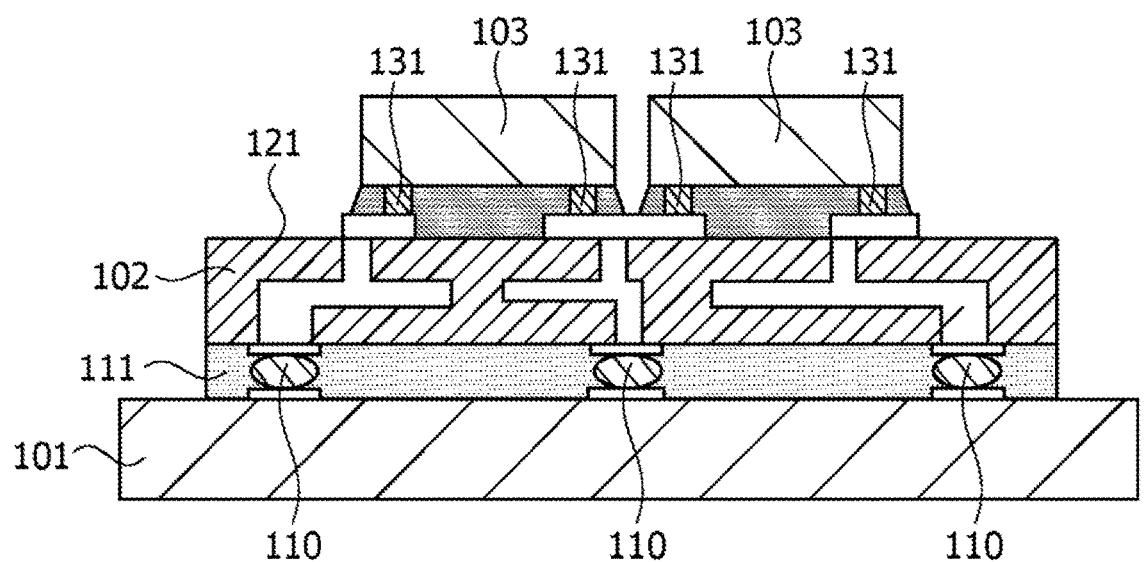

As illustrated in FIG. 10, conductive members 11A and 11B may be formed between the printed circuit board 2 and the resin interposer 3. FIG. 10 is a cross-sectional view of the electronic device 10. When a semiconductor chip 4A is mounted over the resin interposer 3, coupling terminals 14A of the semiconductor chip 4A are joined to metal pads 7A of the resin interposer 3. When a semiconductor chip 4B is mounted over the resin interposer 3, coupling terminals 14B of the semiconductor chip 4B are joined to metal pads 7B of the resin interposer 3.

For example, the conductive member 11A may be a power-supply line and the conductive member 11B may be a ground line. For another example, the conductive member 11A may be a ground line and the conductive member 11B may be a power-supply line. The conductive member 11A is electrically coupled to a metal pad 5B formed on the upper face 21 of the printed circuit board 2 and is electrically coupled to a metal pad 6B formed on the first face 31 of the resin interposer 3. The conductive member 11B is electrically coupled to a metal pad 5C formed on the upper face 21 of the printed circuit board 2 and is electrically coupled to a metal pad 6C formed on the first face 31 of the resin interposer 3. The conductive member 11A may be joined to the metal pad 5B formed on the upper face 21 of the printed circuit board 2. The conductive member 11A may be joined to the metal pad 6B formed on the first face 31 of the resin interposer 3. The conductive member 11B may be joined to the metal pad 5C formed on the upper face 21 of the printed circuit board 2. The conductive member 11B may be joined to the metal pad 6C formed on the first face 31 of the resin interposer 3.

Since using the conductive member 11A as a power-supply line and using the conductive member 11B as a ground line obviate the desire for making space for forming a power-supply line and a ground line in a peripheral portion of the first face 31 of the resin interposer 3, upsizing of the resin interposer 3 may be inhibited. Since using the conductive member 11A as a ground line and using the conductive member 11B as a power-supply line obviate the desire for making space for forming a power-supply line and a ground line in the peripheral portion of the first face 31 of the resin interposer 3, upsizing of the resin interposer 3 may be inhibited. Thus, enlargement of an area of the printed circuit board 2 over which the resin interposer 3 is mounted may be inhibited.

The metal pads 7A may overlap the conductive member 11A in a plan view. As a result of the metal pads 7A, the semiconductor chip 4A, and the coupling terminals 14A overlapping the conductive member 11A in a plan view, evenness in the region included in the second face 32 of the resin interposer 3 over which the semiconductor chip 4A is mounted is increased. The metal pads 7B may overlap the conductive member 11B in a plan view. As a result of the metal pads 7B, the semiconductor chip 4B, and the coupling terminals 14B overlapping the conductive member 11B in a plan view, evenness in the region included in the second face 32 of the resin interposer 3 over which the semiconductor chip 4B is mounted is increased.

Method of Manufacturing Electronic Device 10

The electronic device 10 is manufactured by a method similar to the method of manufacturing the semiconductor device 1. The electronic device 10 is manufactured by for example, performing processes similar to the processes illustrated in FIGS. 3, 4, and 6.

Embodiment 1

The semiconductor device 1 is described below in an embodiment. The printed circuit board 2 having a thickness of 0.3 mm is prepared and a Pb-free solder paste, which is Item No. M705 made by Senju Metal Industry Co., Ltd. for example, is formed on the metal pads 5A that each have a diameter Φ of 90 μm by printing. The metal pads 5A contain Cu, Ni, and Au. The solder bumps 12 are formed on the metal pads 5A by performing the reflow heat treatment and forming the solder paste into bump shapes. The diameter Φ of each solder bump 12 is 90 μm and the height of each solder bump 12 is 90 μm. A silver paste is formed on the upper face 21 of the printed circuit board 2 by printing on a silver paste, which is made by Bando Chemical Industries, Ltd. for example.

The resin interposer 3 is prepared and aligned using a flip-chip bonder to be mounted over the printed circuit board 2. The metal pads 6A that each have a diameter Φ of 90 μm are formed in the peripheral portion of the first face 31 of the resin interposer 3 and the metal pads 7 that each have a diameter Φ of 25 μm are formed in the central portion of the second face 32 of the resin interposer 3. The solder bumps 12 are joined to the metal pads 5A by performing the reflow heat treatment. It is assumed that the process temperature of the reflow heat treatment is 260° C. and the process time of the reflow heat treatment is 60 seconds. The conductive member 11 is formed by performing the heat treatment and hardening the silver paste.

The semiconductor chips 4 with the coupling terminals 14 are prepared and the coupling terminals 14 of the semiconductor chips 4 are joined to the metal pads 7 by performing the reflow heat treatment. Each coupling terminal 14 includes a Cu post, which has a diameter Φ of 25 μm and a height of 20 μm, and a SnAg solder portion, which is formed on the copper post and has a height of 10 μm. The underfill 15 is filled between the resin interposer 3 and the semiconductor chips 4 and then hardened by performing the cure (heat treatment) at 165° C., and the semiconductor device 1 is manufactured.

Embodiment 2

The electronic device 10 is described below in an embodiment. The printed circuit board 2 having a thickness of 0.3 mm is prepared and a Pb-free solder paste, which is Item No. M705 made by Senju Metal Industry Co., Ltd. for example, is formed on the metal pads 5A that each have a diameter Φ of 90 μm by printing. The metal pads 5A contain Cu, Ni, and Au. The solder bumps 12 are formed on the metal pads 5A by performing the reflow heat treatment and forming the solder paste into bump shapes. The diameter Φ of each solder bump 12 is 90 μm and the height of each solder bump 12 is 90 μm. A silver paste is formed on the upper face 21 of the printed circuit board 2 by printing on a silver paste, which is made by Bando Chemical Industries, Ltd. for example.

The resin interposer 3 is prepared and aligned using a flip-chip bonder to be mounted over the printed circuit board 2. The metal pads 6A that each have a diameter Φ of 90 μm are formed in the peripheral portion of the first face 31 of the resin interposer 3 and the metal pads 7 that each have a diameter Φ of 25 μm are formed in the central portion of the second face 32 of the resin interposer 3. The solder bumps 12 are joined to the metal pads 5A by performing the reflow heat treatment. It is assumed that the process temperature of the reflow heat treatment is 260° C. and the process time of the reflow heat treatment is 60 seconds. The silver paste is hardened by performing the heat treatment to form the conductive member 11, and the electronic device 10 is manufactured.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
   a printed circuit board that includes a first electrode formed on a first central portion of the printed circuit board and a second electrode formed on a first peripheral portion surrounding the first central portion;
   a resin substrate formed above the printed circuit board and includes a third electrode formed on a second central portion of a first face directed toward the printed circuit board, and a fourth electrode formed on a second peripheral portion surrounding the second central portion;
   a semiconductor chip arranged over the resin substrate;
   a conductive member that is formed between the first central portion of the printed circuit board and the second central portion of the resin substrate and contains a conductive particle and resin;
   a solder bump that is formed between the first peripheral portion of the printed circuit board and the second peripheral portion of the resin substrate and coupled to the fourth electrode and the second electrode; and
   a solder resist that covers the solder bump and contacts the conductive member,
   wherein the conductive member that comes into contact with the printed circuit board and the first portion of the first face of the resin substrate without contacting the solder bump, and the first electrode and the third electrode are electrically coupled by the conductive member.

2. The semiconductor device according to claim 1, wherein
   a particle diameter of the conductive particle is smaller than a height of the solder bump.

3. An electronic device comprising:
   a printed circuit board that includes a first electrode formed on a first central portion of the printed circuit board and a second electrode formed on a first peripheral portion surrounding the first central portion;
   a resin substrate formed above the printed circuit board and includes a third electrode formed on a second central portion of a first face directed toward the printed circuit board, and a fourth electrode formed on a second peripheral portion surrounding the second central portion;

a conductive member that is formed between the first central portion of the printed circuit board and the second central portion of the resin substrate and contains a conductive particle and resin;

a solder bump that is formed between the first peripheral portion of the printed circuit board and the second peripheral portion of the resin substrate and coupled to the fourth electrode and the second electrode; and a solder resist that covers the solder bump and contacts the conductive member, wherein the conductive member that comes into contact with the printed circuit board and the first portion of the first face of the resin substrate without contacting the solder bump, and the first electrode and the third electrode are electrically coupled by the conductive member.

* * * * *